US008436739B2

(12) United States Patent
Elms et al.

(10) Patent No.: US 8,436,739 B2
(45) Date of Patent: *May 7, 2013

(54) ELECTRICAL SWITCHING APPARATUS INCLUDING A TRIP COIL OPEN CIRCUIT TEST CIRCUIT AND SYSTEM INCLUDING THE SAME

(75) Inventors: Robert T. Elms, Monroeville, PA (US); William J. Murphy, Cranberry Township, PA (US)

(73) Assignee: Eaton Corporation, Cleveland, OH (US)

( * ) Notice: Subject to any disclaimer, the term of this patent is extended or adjusted under 35 U.S.C. 154(b) by 1276 days.

This patent is subject to a terminal disclaimer.

(21) Appl. No.: 12/206,194

(22) Filed: Sep. 8, 2008

(65) Prior Publication Data

US 2010/0060468 A1 Mar. 11, 2010

(51) Int. Cl.
*G08B 21/00* (2006.01)
(52) U.S. Cl.
USPC ............. 340/638; 340/391.1; 340/815.4
(58) Field of Classification Search .......... 340/638, 340/639, 391.1, 815.4, 531, 635, 3.43, 650, 340/657, 825.72, 398.3, 388.7
See application file for complete search history.

(56) References Cited

U.S. PATENT DOCUMENTS

| 4,105,965 | A  | * | 8/1978  | Russell ................. 324/424 |
| 4,377,837 | A  | * | 3/1983  | Matsko et al. ............ 361/105 |
| 5,966,280 | A  | * | 10/1999 | Cerminara et al. ......... 361/47 |
| 6,807,035 | B1 | * | 10/2004 | Baldwin et al. ........... 361/42 |
| 8,004,418 | B2 | * | 8/2011  | Hetzmannseder et al. ... 340/639 |
| 2002/0158725 | A1 | * | 10/2002 | Nerstrom et al. ........... 335/17 |
| 2003/0169548 | A1 | * | 9/2003  | Clarey et al. ............. 361/78 |
| 2009/0027146 | A1 | * | 1/2009  | Mills et al. .............. 335/18 |

OTHER PUBLICATIONS

Atmel Corporation, "hf/rf ZONE Products for the week of Nov. 1, 2004", hf/rfZONE Product Review: Atmel ATA5278 Family of RF Car Access Devices, 2004, 2 pp.
Atmel Corporation, "Stand-alone Antenna Driver", ATA5278, 2007, 34 pp.

* cited by examiner

*Primary Examiner* — Daniel Previl
(74) *Attorney, Agent, or Firm* — Eckert Seamans Cherin & Mellott, LLC; Kirk D. Houser

(57) ABSTRACT

A circuit breaker includes separable contacts, an operating mechanism structured to open and close the separable contacts, and a trip circuit including a trip coil and a fault detector. The fault detector energizes the trip coil to cause the operating mechanism to open the separable contacts. A test circuit is structured to test the trip coil and determine an open circuit condition thereof. An annunciation circuit is structured to annunciate the open circuit condition of the trip coil.

21 Claims, 3 Drawing Sheets

ELECTRICAL SWITCHING APPARATUS INCLUDING A TRIP COIL OPEN CIRCUIT TEST CIRCUIT AND SYSTEM INCLUDING THE SAME

BACKGROUND OF THE INVENTION

1. Field of the Invention

This invention pertains generally to electrical switching apparatus, such as circuit interrupters, and, more particularly, to arc fault and/or ground fault circuit interrupters including a test circuit.

2. Background Information

Electrical switching apparatus include, for example, circuit switching devices and circuit interrupters such as circuit breakers, contactors, motor starters, motor controllers and other load controllers.

Ground fault circuit interrupters (GFCIs) include ground fault circuit breakers (GFCBs), ground fault switches, ground fault receptacles, and other ground fault contactors, motor starters, motor controllers and other load controllers.

Arc fault circuit interrupters (AFCIs) include arc fault circuit breakers (AFCBs), arc fault switches, arc fault receptacles, and other arc fault contactors, motor starters, motor controllers and other load controllers.

When the trip coil of known AFCI/GFCI circuit breakers fails to an open circuit condition, such circuit breakers are unable to provide arc fault or ground fault protection, and are unable to provide a warning of this condition to the user.

There is room for improvement in electrical switching apparatus including a trip coil.

There is also room for improvement in systems including electrical switching apparatus.

SUMMARY OF THE INVENTION

These needs and others are met by embodiments of the invention, which detect a trip coil failure and provide a corresponding annunciation of this condition.

For example, the annunciation can be through a communication from an electrical switching apparatus to a receiver in, at, on or near an electrical distribution panel, which houses the electrical switching apparatus. In turn, the receiver provides an alert that annunciates the failure condition to a user.

In accordance with one aspect of the invention, an electrical switching apparatus comprises: separable contacts; an operating mechanism structured to open and close the separable contacts; a trip circuit comprising a trip coil and a fault detector, which energizes the trip coil to cause the operating mechanism to open the separable contacts; a test circuit structured to test the trip coil and determine an open circuit condition thereof; and an annunciation circuit structured to annunciate the open circuit condition of the trip coil.

The trip coil may include a voltage; and the test circuit may further be structured to sense the voltage of the trip coil, determine if the voltage is greater than a predetermined value, and responsively determine the open circuit condition.

The trip circuit may normally be powered through the trip coil in the absence of the open circuit condition; and the trip circuit may be powered through the test circuit during the open circuit condition.

The test circuit may comprise the series combination of a resistor and a bi-directional light emitting diode; and during the open circuit condition, a predetermined current may flow through the series combination.

In the absence of the open circuit condition, the voltage of the trip coil may be insufficient to illuminate the bi-directional light emitting diode.

As another aspect of the invention, a system comprises: an electrical switching apparatus comprising: separable contacts, an operating mechanism structured to open and close the separable contacts, a trip circuit comprising a trip coil and a fault detector, which energizes the trip coil to cause the operating mechanism to open the separable contacts, a test circuit structured to test the trip coil and determine an open circuit condition thereof, and a communication circuit structured to communicate the open circuit condition of the trip coil; and an electrical distribution panel comprising: a housing the electrical switching apparatus, and a receiver structured to receive the open circuit condition of the trip coil from the communication circuit and annunciate the open circuit condition.

The receiver may be in, at, on or near the electrical distribution panel.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "electrical distribution panel" shall mean a load center or a panelboard.

As employed herein, the term "bi-directional LED" shall mean a light emitting diode, which is electrically connected, or which can be electrically connected, in series with a resistor, and which can be illuminated by current flowing in either direction through the resistor and through the bi-directional LED.

The invention is described in association with an arc fault circuit breaker, although the invention is applicable to a wide range of electrical switching apparatus, such as, for example and without limitation, GFCIs and AFCI/GFCIs.

Figure 1:
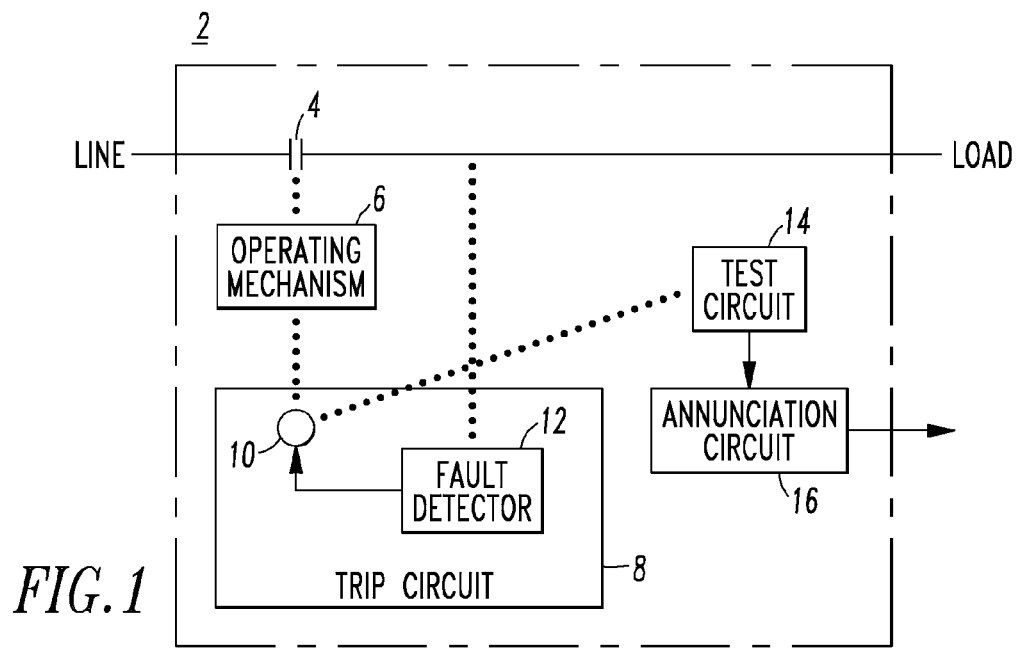
FIG. 1 is a block diagram of a circuit breaker in accordance with embodiments of the invention.

Referring to FIG. 1, an electrical switching apparatus, such as a circuit breaker 2, includes separable contacts 4, an operating mechanism 6 structured to open and close the separable contacts 4, and a trip circuit 8 including a trip coil 10 and a fault detector 12. The fault detector 12 energizes the trip coil 10 to cause the operating mechanism 6 to open the separable contacts 4. A test circuit 14 is structured to test the trip coil 10 and determine an open circuit condition thereof. An annunciation circuit 16 is structured to annunciate the open circuit condition of the trip coil 10.

Example 1

Figure 2:
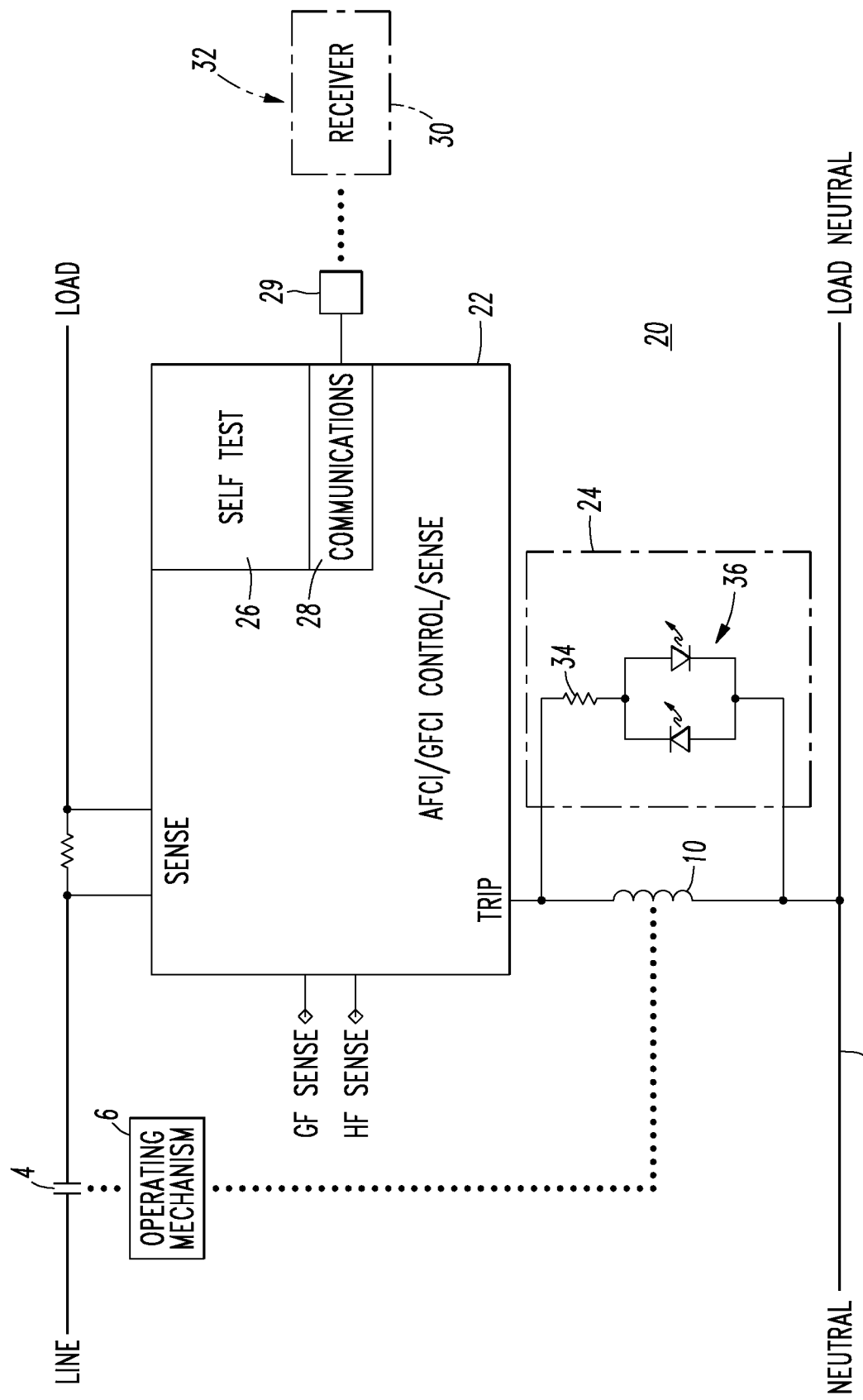
FIG. 2 is a block diagram of a circuit breaker in accordance with another embodiment of the invention.

FIG. 2 shows an arc fault/ground fault circuit breaker 20 including the separable contacts 4, the operating mechanism 6 and the trip coil 10 of FIG. 1, along with an AFCI/GFCI control/sense circuit 22, an open coil sense and indication circuit 24, a self test circuit 26 and a communications circuit 28. It will be appreciated that these circuits 22,24,26,28 can be combined and/or can be implemented by any suitable number of analog, digital and/or processor-based circuits. The example circuits 22,24,26,28 cooperatively detect and communicate circuit breaker failure states to a receiver 30 (shown in phantom line drawing) in, at, on or near an electrical distribution panel 32 (shown in phantom line drawing). One or both of the open coil sense and indication circuit 24 and the self test circuit 26 detect a failure of the trip coil 10. One or both of the open coil sense and indication circuit 24 and the communications circuit 28 provide a corresponding annunciation of this failure condition.

Example 2

In this example, the trip coil 10 includes a voltage. One or both of the open coil sense and indication circuit 24 and the self test circuit 26 can be a test circuit structured to sense the voltage of the trip coil 10, determine if that voltage is greater than a predetermined value, and responsively determine an open circuit condition of the trip coil 10.

The circuit 24, as shown, includes the series combination of a resistor 34 and a bi-directional light emitting diode (LED) 36 (i.e., the LED is illuminated by current flowing in either direction through the resistor 34). As will be described, during the open circuit condition of the trip coil 10, a predetermined current flows through that series combination. In the absence of that open circuit condition, the voltage of the trip coil 10 is insufficient to illuminate the bi-directional LED 36.

The detection of the open trip coil 10 of the circuit breaker 20 is possible since the operating power for the AFCI/GFCI control/sense circuit 22 is normally obtained through the trip coil 10. Nominal operating current (e.g., without limitation, about 12 mA, which is insufficient to energize the trip coil 10) for the circuit 22 normally flows between the load side of the separable contacts 4 and a neutral conductor 38, and through the circuit 22 and the trip coil 10.

When the trip coil 10 is open, for example and without limitation, about 12 mA of current would otherwise flow through it. Here, an alternate path for this current is provided by the series combination of the resistor 34 and the bi-directional LED 36 when the trip coil 10 is open. Hence, the AFCI/GFCI control/sense circuit 22, which provides the AFCI/GFCI fault detection function, is normally powered through the trip coil 10 in the absence of its open circuit fault condition, and is alternatively powered through the circuit 24, which provides a test function, during the trip coil open circuit fault condition. The series combination of the resistor 34 and the bi-directional LED 36 is advantageously electrically connected in parallel with the trip coil 10, and illuminates the bi-directional LED 36 and powers the circuit 22 during the trip coil open circuit fault condition.

Example 3

For example and without limitation, the resistance of the trip coil 10 is normally about 20 ohms and with the nominal current through the AFCI/GFCI control/sense circuit 22 of about 12 mA, the voltage across the trip coil 10 is, thus, normally about 0.2 V. The example resistance of resistor 34 is about 5 kΩ (with a 3 W power rating to make this circuit highly reliable) and the voltage thereacross is, thus, about 50 V when the trip coil 10 is open. If the trip coil 10 is open, then the current through resistor 34 provides the power to operate the circuit 22 and, also, lights the LED 36 to visually indicate the trip coil failure. Hence, the open coil status sensor provided by the circuit 24 can preferably be sized to provide an alternate path in order to keep the electronics of the AFCI/GFCI control/sense circuit 22 operational and/or to illuminate the LED 36 for failure indication.

Example 4

The self test circuit 26 of the circuit breaker 20 can monitor a wide range of other trip functions in addition to the open trip coil fault condition. See, for example, Examples 9 and 10, below. For example, in addition to the function provided by the circuit 24, the self test circuit 26 can monitor the open trip coil fault condition by sensing the voltage across the trip coil 20 (e.g., a voltage greater than a predetermined value indicates a failure) in order to indicate the open trip coil fault condition. Preferably, if a failure is detected by the self test circuit 26, then the communications circuit 28 annunciates the failure.

Example 5

The communications circuit 28 can provide an annunciation function by using, for example and without limitation, a magnetic loop driver and an antenna coil driven by the magnetic loop driver, or an infrared light emitting diode. For example, the magnetic loop driver and the antenna coil, or the infrared light emitting diode, can output a magnetic loop, or a wireless signal (e.g., an infrared light emitting diode signal; radio frequency), respectively, including the trip coil open circuit fault condition to the receiver 30, which is in, at, on or near the electrical distribution panel 32. The receiver 30, in turn, annunciates the fault condition.

Example 6

For example and without limitation, an about 50 kHz to about 200 kHz magnetic loop can be employed.

For example, a suitable magnetic loop or magnetically coupled signal can be provided by a low frequency antenna driver IC ATA5278 marketed by Atmel Corporation of San Jose, Calif. The antenna driver device generates a magnetic low frequency field in conjunction with an antenna coil to transmit data to the example receiver 30. The carrier range can be between about 100 kHz and 150 kHz and modulation can have baud rates between about 1 kbaud and 4 kbaud.

Example 7

For example and without limitation, an output 29, such as an infrared light emitting diode (IRLED) can have a suitable periodic pulsed current driven by the communications circuit 28. The IRLED can direct infrared light, for example, into the inside of the electrical distribution panel 32.

Example 8

The self test circuit 26 can monitor the voltage across the trip coil 10. The open coil sense and indication circuit 24 is a parallel, failure indication circuit including a series circuit having the power resistor 34 and the inverse-parallel LED 36. The circuit 24 is in parallel with the trip coil 10.

It is believed that UL943 (ground fault standard) will soon require products to fail safe (i.e., trip or produce an indication of failure) when certain components are faulted.

The example circuit 24 produces a suitable fail safe function (e.g., an indication of failure of an open-circuited trip coil). If the trip coil 10 fails open (or fails short, which quickly turns into a fail open), then the power supply current, needed for arc fault and/or ground fault circuit interrupter circuit operation, will take the alternate path through the parallel circuit 24, thereby illuminating the LED 36.

The circuit 22 can include, for example and without limitation, one or more of a ground fault detector, a parallel arc fault detector, and a series arc fault detector. Preferably, the self test circuit 26 is structured to test at least one of the ground fault detector, the parallel arc fault detector, and the series arc fault detector. For example, the arc fault detector is structured to energize the trip coil 10 in response to detection of an arc fault condition.

Example 9

The self test circuit 26 can include a microprocessor (µP) to determine if a number of trip functions of the circuit 22 are not working, including the AFCI/GFCI trip function. Thus, the µP is structured to determine operability of the number of trip functions, including that of the trip coil 10.

For example and without limitation, the impedance of the trip coil 10 is about 20Ω, such that during normal operation when the circuit 22 uses about 12 mA of power supply current, the voltage of the trip coil 10 is only about 0.24 V, which is too small to activate the LED 36.

Example 10

Figure 3:
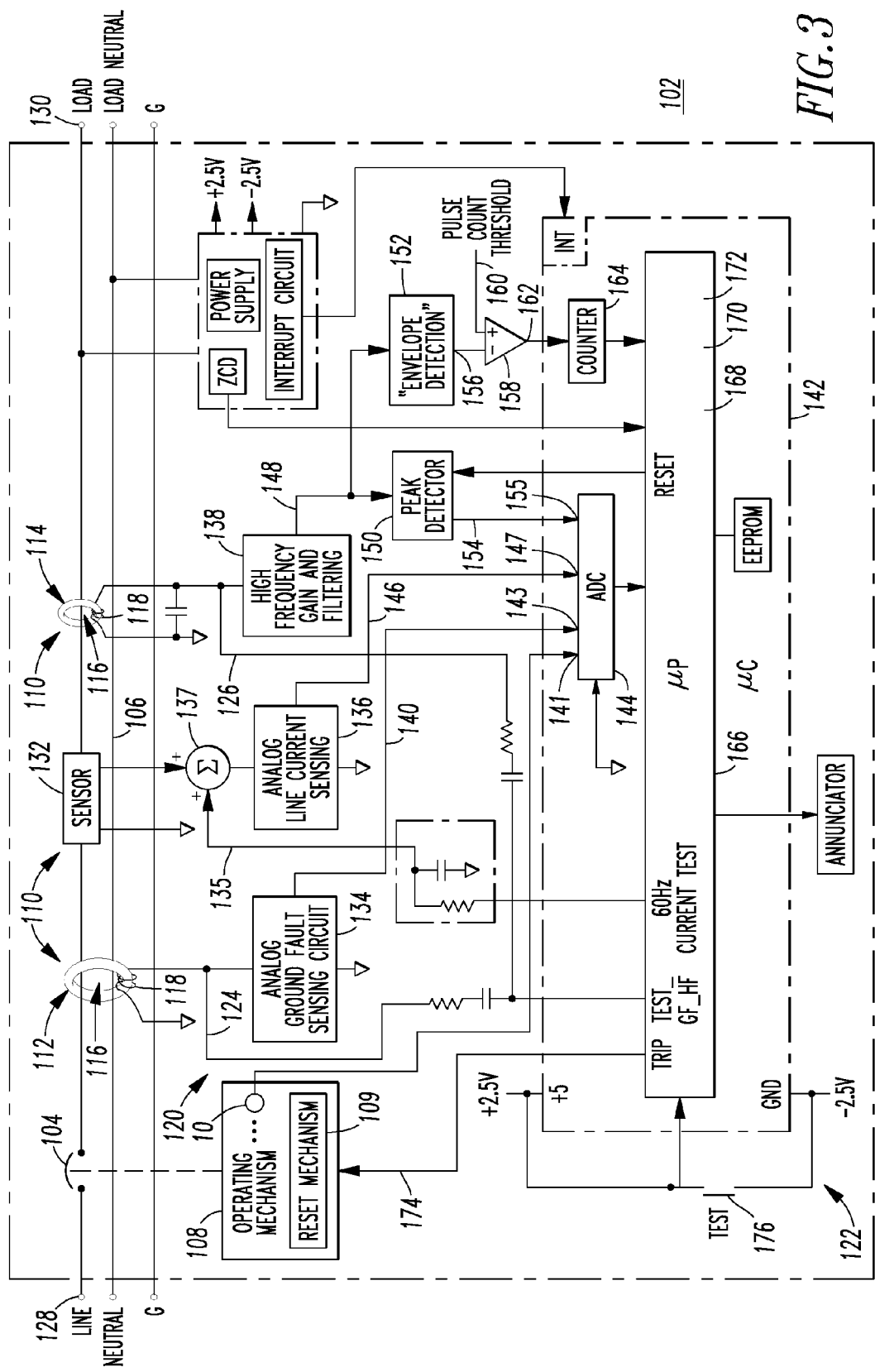
FIG. 3 is a block diagram in schematic form of a circuit breaker in accordance with another embodiment of the invention.

Referring to FIG. 3, a circuit interrupter (e.g., without limitation, such as ground fault circuit interrupter/arc fault circuit interrupter 102) includes separable contacts 104, a neutral conductor 106, and an operating mechanism 108 structured to open and close the separable contacts 104. A number of current sensors 110 are structured to sense at least current flowing through the separable contacts 104. Each of the current sensors 112,114 includes a primary winding 116 and a secondary winding 118. The primary winding 116 is electrically connected in series with the separable contacts 104. A trip mechanism 120 is structured to cooperate with the secondary windings 118 and the operating mechanism 108 to trip open the separable contacts 104. Preferably, the operating mechanism 108 includes or cooperates with a suitable reset mechanism 109, which is structured to cooperate with the operating mechanism 108 to close the separable contacts 104 after the operating mechanism 108 trips open the separable contacts 104. A test circuit 122 tests the current sensors 110 and the trip mechanism 120 and is structured to apply stimulus test signals 124,126 directly to the secondary windings 118 of the current sensors 112,114, and a test signal 135 to a summer 137 at the output of current sensor 132. This advantageously allows the stimulus test signals 124,126 to be several orders of magnitude (i.e., as reduced by the turns ratio of the current sensors 112,114) lower than that needed at the primary winding 116. For example, injecting relatively high frequency current signals onto a power line can be in violation of FCC rules if this exceeds FCC limits, which are typically lower than the values used for arc fault detection.

For example, for ground fault detection, the current sensor 112 is a current transformer structured to sense a difference between the current flowing through the separable contacts 104 from the line terminal 128 to the load terminal 130 and a current flowing through the neutral conductor 106. Also, for series arc fault detection, the current sensor 114 is a current transformer structured to sense the current flowing through the separable contacts 104. For purposes of series arc fault detection, that current includes frequencies greater than about 100 kHz, and the current sensor 114 is structured to sense that current including those frequencies. The other current sensor 132 is a suitable shunt structured to sense the current flowing through the separable contacts 104 for purposes of parallel arc fault detection.

An analog ground fault sensing circuit 134 cooperates with the current sensor 112, an analog line current sensing circuit 136 and the summer 137 cooperate with the current sensor 132, and an analog series arc fault sensing circuit 138, which provides high frequency gain and filtering, cooperates with the current sensor 114. The analog ground fault sensing circuit 134 outputs a sensed signal 140 to a microcomputer (µC) 142 and, in particular, to channel 143 of analog-to-digital converter (ADC) 144 thereof. The analog line current sensing circuit 136 outputs a sensed signal 146 to channel 147 of the µC ADC 144. The analog series arc fault sensing circuit 138 outputs a sensed signal 148 to a peak detector circuit 150 and to an envelope detection circuit 152. The peak detector circuit 150 outputs a peak signal 154 to channel 155 of the µC ADC 144. The output 156 of the envelope detection circuit 152 is input by the negative input of a comparator 158, which uses a reference (PULSE COUNT THRESHOLD) 160 at its positive input. The output 162 of the comparator 158 is input by a counter 164 of the µC 142.

The µC 142 includes a microprocessor (µP) 166 having routines 168, 170 and 172 that respectively provide a ground fault detector cooperating with the analog ground fault sensing circuit 134, a parallel arc fault detector cooperating with the analog line current sensing circuit 136, and a series arc fault detector cooperating with the analog series arc fault sensing circuit 138 through the peak detector circuit 150, the envelope detection circuit 152, the comparator 158 and the counter 164.

The test circuit 122 is structured to provide both of (i) a first test of the current sensor 112 and the analog ground fault sensing circuit 134 and (ii) a second test of the current sensor 114 and the analog series arc fault sensing circuit 138, and to cause the trip mechanism 120 to cooperate with the operating mechanism 8 to output a trip signal 174 and trip open the separable contacts 104 responsive to failure of at least one of the first test and the second test, and, otherwise, to maintain the separable contacts 104 closed responsive to passage of both of the first test and the second test.

The current sensor 112 and the analog ground fault sensing circuit 134 have a first transfer function. Also, the current sensor 114 and the analog series arc fault sensing circuit 138 have a second transfer function. The test circuit 122 is further structured to provide the test signal 124 to the current sensor 112 and the analog ground fault sensing circuit 134 to test the first transfer function without causing a ground fault to be detected by the ground fault detector routine 168. The test circuit 122 is also structured to provide the test signal 126 to the current sensor 114 and the analog series arc fault sensing circuit 138 to test the second transfer function (e.g., without limitation, resulting from high frequency resonance of the current sensor 114) without causing an arc fault to be detected by the series arc fault detector routine 172.

As a non-limiting example, the current sensor 114 may be structured to resonate at a certain frequency. The circuit 138 may be structured to convert the current output of the current sensor 114 to a voltage signal by a first op-amp circuit (not shown), which is then filtered by a second op-amp circuit (not shown). Hence, the combined circuit 114,138 could misoperate in several ways: (1) the sensing coil (secondary winding 118) could be an open-circuit; (2) the coil center frequency or output at resonance could be out-of-tolerance; (3) the gain of the first op-amp circuit could be out-of-tolerance; and (4) the filter characteristics of the second op-amp circuit could be out-of-tolerance. This self-test is structured to stimulate the high frequency sensing coil at or near its resonant frequency, measure the total circuit response at the µP 166, and detect any of these failure modes, which could occur either individually or in combination.

Various tests can include: (1) ground fault current sensing: verify the operation of the analog ground fault sensing circuit 134, the corresponding transfer function of the current sensor 112 and the circuit 134, and the continuity (coil continuity) of the coil (secondary winding 118) of the current sensor 112; (2) parallel arc fault current sensing: verify the operation of the analog parallel arc fault line current sensing circuit 136 and the validity of the corresponding transfer function thereof, (3) series arc fault high frequency current sensing: verify the operation of the analog series arc fault sensing circuit 138, the corresponding transfer function of the current sensor 114 (e.g., without limitation, a current transformer structured to resonate in response to frequencies greater than about 100 kHz; about 1 MHz), the circuit 138, the peak detector 150 and the envelope detection circuit 152, and the continuity (coil continuity) of the coil (secondary winding 118) of the current sensor 114; and (4) voltage of the trip coil 10 as sensed through channel 141 of ADC 144.

By injecting the test signals 124,126 directly to the secondary windings 118 and below the corresponding fault detection levels of the routines 168,172, this permits the test circuit 122 to evaluate the transfer function gain of the first and second transfer functions, rather than causing a direct trip. This advantageously permits both of the first test and the second test to be conducted before causing the trip mechanism 120 to cooperate with the operating mechanism 108 to trip open the separable contacts 104. For example, fault detection usually involves detection of a fault condition, which persists for some period of time. In order to prevent tripping on the test signals 124,126, these signals could either fail to meet the fault condition criteria or persist for less than the specified trip time period, or both. Hence, this permits the evaluation of multiple functions.

The trip mechanism 120 includes the ground fault detector routine 168, the parallel arc fault detector routine 170 and the series arc fault detector routine 172. The test circuit 122 is structured to respond to test pushbutton 176 and provide all of (i) a first test of the current sensor 112 and the analog ground fault sensing circuit 134, (ii) a second test of the current sensor 132 and the analog line current sensing circuit 136, and (iii) a third test of the current sensor 114 and the high frequency gain and filtering circuit 138, to cause the trip mechanism 120 to cooperate with the operating mechanism 108 to trip open the separable contacts 104 responsive to passage of all of this first test, second test and third test, and, otherwise, to maintain the separable contacts 104 closed responsive to failure of at least one of such first test, second test and third test. This sequentially evaluates plural different protective functions (i.e., in this example, ground fault, parallel arc fault and series arc fault) with the single test pushbutton 176, and requires all of these protective functions to be good before the self-test is completed with a positive indication (i.e., tripping the circuit interrupter 102).

Example 11

Figure 4:
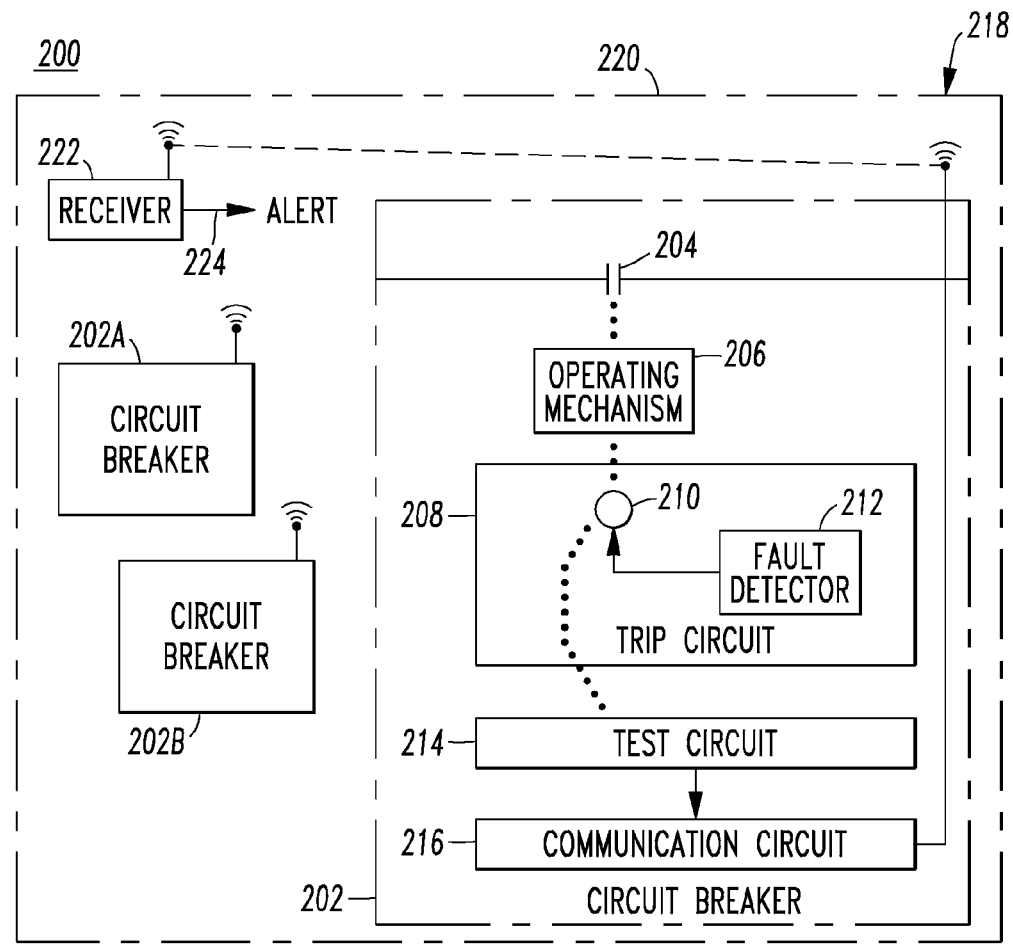
FIG. 4 is a block diagram of a system including a circuit breaker and an electrical distribution panel in accordance with another embodiment of the invention.

Referring to FIG. 4, a system 200 includes an electrical switching apparatus, such as the example circuit breaker 202 (e.g., an arc fault/ground fault circuit breaker), including separable contacts 204, an operating mechanism 206 structured to open and close the separable contacts 204, a trip circuit 208 including a trip coil 210 and a fault detector 212, which energizes the trip coil 210 to cause the operating mechanism 206 to open the separable contacts 204, a test circuit 214 structured to test the trip coil 210 and determine an open circuit condition thereof, and a communication circuit 216 structured to communicate the open circuit condition of the trip coil 210. The system 200 also includes an electrical distribution panel, such as a panelboard 218, including a housing 220 housing a number of circuit breakers, such as 202,202A,202B, and a receiver 222 structured to receive the open circuit condition of the trip coil 210 from the communication circuit 216 and annunciate the open circuit condition.

Example 12

The receiver 222 is preferably in (as shown), at, on or near the electrical distribution panel 218.

Example 13

The annunciation can be through example wireless communications from the circuit breaker 202 to the receiver 222 in, at, on or near an electrical distribution panel 218, which houses the number of circuit breakers 202,202A,202B. In turn, the receiver 222 provides an alert 224 that annunciates the failure condition to a user (not shown).

Example 14

Although separable contacts 4,104,204 are disclosed, suitable solid state separable contacts may be employed. For example, the disclosed circuit breakers 2,102,202 include a suitable circuit interrupter mechanism, such as the separable contacts 4,104,204 that are opened and closed by the operating mechanism 8,108,206 although the invention is applicable to a wide range of circuit interruption mechanisms (e.g., without limitation, solid state or FET switches; contactor contacts) and/or solid state based control/protection devices (e.g., without limitation, drives; soft-starters).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:
1. An electrical switching apparatus comprising:
   separable contacts;
   an operating mechanism structured to open and close said separable contacts;
   a trip circuit comprising a trip coil and a fault detector, which energizes said trip coil to cause said operating mechanism to open said separable contacts;

a test circuit structured to test said trip coil and determine an open circuit condition thereof; and an annunciation circuit structured to annunciate the open circuit condition of said trip coil.

2. The electrical switching apparatus of claim 1 wherein said trip coil includes a voltage; and wherein said test circuit is further structured to sense the voltage of said trip coil, determine if said voltage is greater than a predetermined value, and responsively determine said open circuit condition.

3. The electrical switching apparatus of claim 1 wherein said trip circuit is normally powered through said trip coil in the absence of said open circuit condition; and wherein said trip circuit is powered through said test circuit during said open circuit condition.

4. The electrical switching apparatus of claim 3 wherein said test circuit comprises the series combination of a resistor and a bi-directional light emitting diode; and wherein during said open circuit condition, a predetermined current flows through said series combination.

5. The electrical switching apparatus of claim 4 wherein said series combination illuminates said bi-directional light emitting diode and powers said trip circuit during said open circuit condition.

6. The electrical switching apparatus of claim 4 wherein said trip coil includes a voltage; wherein said test circuit is further structured to sense the voltage of said trip coil; and wherein in the absence of said open circuit condition, said voltage is insufficient to illuminate said bi-directional light emitting diode.

7. The electrical switching apparatus of claim 4 wherein said series combination is electrically connected in parallel with said trip coil.

8. The electrical switching apparatus of claim 7 wherein said series combination is structured to indicate said open circuit condition.

9. The electrical switching apparatus of claim 1 wherein said fault detector comprises at least one of a ground fault detector, a parallel arc fault detector, and a series arc fault detector; and wherein said test circuit is further structured to test said at least one of the ground fault detector, the parallel arc fault detector, and the series arc fault detector.

10. The electrical switching apparatus of claim 1 wherein said fault detector is an arc fault detector, which is structured to energize said trip coil in response to detection of an arc fault condition.

11. The electrical switching apparatus of claim 1 wherein said annunciation circuit comprises a magnetic loop driver and an antenna coil driven by said magnetic loop driver.

12. The electrical switching apparatus of claim 1 wherein said annunciation circuit is an infrared light emitting diode.

13. The electrical switching apparatus of claim 1 wherein said trip circuit includes a number of trip functions; and wherein said test circuit comprises a processor structured to determine operability of said number of trip functions and said trip coil.

14. A system comprising:
an electrical switching apparatus comprising:
separable contacts,
an operating mechanism structured to open and close said separable contacts,
a trip circuit comprising a trip coil and a fault detector, which energizes said trip coil to cause said operating mechanism to open said separable contacts,
a test circuit structured to test said trip coil and determine an open circuit condition thereof, and
a communication circuit structured to communicate the open circuit condition of said trip coil; and
an electrical distribution panel comprising:
a housing said electrical switching apparatus, and
a receiver structured to receive the open circuit condition of said trip coil from said communication circuit and annunciate said open circuit condition.

15. The system of claim 14 wherein said receiver is in, at, on or near said electrical distribution panel.

16. The system of claim 14 wherein said communication circuit is further structured to output a magnetic loop or wireless signal including said open circuit condition to said receiver.

17. The system of claim 14 wherein said communication circuit is further structured to output an infrared light emitting diode signal including said open circuit condition to said receiver.

18. The system of claim 17 wherein said communication circuit is an infrared light emitting diode having a periodic pulsed current; and wherein said infrared light emitting diode directs infrared light into said electrical distribution panel.

19. The system of claim 14 wherein said electrical switching apparatus is a circuit breaker.

20. The system of claim 14 wherein said electrical switching apparatus is an arc fault/ground fault circuit breaker.

21. The system of claim 14 wherein said receiver is separate and distinct from said electrical switching apparatus.

* * * * *